United States Patent
Giltom et al.

(10) Patent No.: US 6,812,087 B2
(45) Date of Patent: Nov. 2, 2004

(54) METHODS OF FORMING NON-VOLATILE RESISTANCE VARIABLE DEVICES AND METHODS OF FORMING SILVER SELENIDE COMPRISING STRUCTURES

(75) Inventors: Terry L. Giltom, Boise, ID (US); Kristy A. Campbell, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/634,897

(22) Filed: Aug. 6, 2003

(65) Prior Publication Data

US 2004/0029351 A1 Feb. 12, 2004

Related U.S. Application Data

(63) Continuation of application No. 10/061,825, filed on Jan. 31, 2002, now abandoned.

(51) Int. Cl.⁷ .......................................... H01L 21/8244
(52) U.S. Cl. ........................ 438/238; 438/650; 438/672
(58) Field of Search ................................. 438/238, 379, 438/381, 650, 666, 669, 672, 380, 682, 686

(56) References Cited

U.S. PATENT DOCUMENTS

| | | |
|---|---|---|
| 1,131,740 A | 3/1915 | Tolutis |
| 3,271,591 A | 9/1966 | Ovshinsky |
| 3,450,967 A | 6/1969 | Tolutis |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |

(List continued on next page.)

FOREIGN PATENT DOCUMENTS

| | | |
|---|---|---|
| GB | 1131740 A | 10/1968 |
| JP | 56126916 A | 5/1981 |
| WO | WO 97/48032 | 12/1997 |
| WO | WO 99/28914 | 6/1999 |
| WO | 00/48196 A1 | 9/2000 |
| WO | 02/21542 A1 | 3/2002 |

OTHER PUBLICATIONS

Y. Kawamoto, "Ionic Conduction in $As_2S_3$–$Ag_2S$, $GeS_2$–$GeS$–$Ag_2S$ and $P_2S_5$–$Ag_2S$ Glasses," J. Non–Crystalline Solids, 20 (1976) 393–404.

U.S. patent application Ser. No. 6,418,049, Li et al., filed Jul. 23, 2002.

U.S. patent application Ser. No. 10/077,867, Campbell et al.

G. Safran, "Development and properties of single–crystal silver selenide layers," Thin Solid Films, 215 (1992) 147–151.

(List continued on next page.)

Primary Examiner—Tuan H. Nguyen
(74) Attorney, Agent, or Firm—Dickstein Shapiro Morin & Oshinsky LLP

(57) ABSTRACT

A method of forming a non-volatile resistance variable device includes forming a patterned mass comprising elemental silver over a substrate. A layer comprising elemental selenium is formed over the substrate and including the patterned mass comprising elemental silver. The substrate is exposed to conditions effective to react only some of the elemental selenium with the elemental silver to form the patterned mass to comprise silver selenide. Unreacted elemental selenium is removed from the substrate. A first conductive electrode is provided in electrical connection with one portion of the patterned mass comprising silver selenide. A germanium selenide comprising material is provided in electrical connection with another portion of the patterned mass comprising silver selenide. A second conductive electrode is provided in electrical connection with the germanium selenide comprising material.

51 Claims, 5 Drawing Sheets

U.S. PATENT DOCUMENTS

| | | |
|---|---|---|
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,350,541 A | 9/1982 | Mizushima et al. |
| 4,405,710 A | 9/1983 | Balasubramanyam et al. |
| 4,410,421 A | 10/1983 | Atherton et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Silwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Kiersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |

| | | | |
|---|---|---|---|
| 6,673,648 B2 | 1/2004 | Lowery | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 2002/0000666 A1 | 1/2002 | Kozicki et al. | |
| 2002/0123170 A1 | 9/2002 | Moore et al. | |
| 2002/0127886 A1 | 9/2002 | Moore et al. | |
| 2002/0163828 A1 | 11/2002 | Krieger et al. | |
| 2002/0168820 A1 | 11/2002 | Kozicki | |
| 2002/0190350 A1 | 12/2002 | Kozicki | |
| 2003/0001229 A1 | 1/2003 | Moore et al. | |
| 2003/0027416 A1 | 2/2003 | Moore | |
| 2003/0035314 A1 | 2/2003 | Kozicki | |
| 2003/0035315 A1 | 2/2003 | Kozicki | |
| 2003/0047765 A1 * | 3/2003 | Campbell | 257/298 |
| 2003/0048744 A1 | 3/2003 | Ovshinsky et al. | |
| 2003/0052330 A1 * | 3/2003 | Klein | 257/154 |
| 2003/0137869 A1 | 7/2003 | Kozicki | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

OTHER PUBLICATIONS

Das et al., "Theory of the characteristic curves of the silver chalcogenide glass inorganic photoresists," 54 Appl. Phys. Lett., No. 18, pp. 1745–1747, May 1989.

Helbert et al., "Intralevel hybrid resist process with submicron capability," SPIE vol. 333, Submicron Lithography, pp. 24–29 (1982).

Hilt, Dissertation: "Materials Characterization of Silver Chalcogenide Programmable Metallization Cells," Arizona State University, pp. title page–114 UMI Company, May 1999.

Holmquist et al., "Reaction and Diffusion in Silver–Arsenic Chalcogenide Glass Systems," 62 J. Amer. Ceram. Soc., Nos. 3–4, pp. 183–188 (Mar.–Apr. 1979).

Huggett et al., "Development of silver sensitized germanium selenide photoresist by reactive sputter etching in SF" 42 Appl. Phys. Lett., No. 7, pp. 592–594 Apr. 1983.

Kawaguchi et al., "Mechanism of photosurface deposition," 164–166, J. Non–Cryst. Solids, pp. 1231–1234 (1993).

McHardy et al., "The dissolution of metals in amorphous chalcogenides and the effects of electron and ultraviolet radiation," 20 J. Phys. C.: Solid State Phys., pp. 4055–4075, (1987).

Miyatani, Electrical properties of Ag2Se, —J. Phys. Soc. Japan, p. 317, 1958.

Mizusaki et al., "Kinetic Studies on the Selenization of Silver," 47 Bul. Chem. Soc. Japan, No. 11, pp. 2851–2855, Nov. 1974.

Owens et al., "Metal–Chalcogenide Photoresists for High Resolution Lithography and Sub–Micron Structures," Nanostructures Physics and Fabrication, pp. 447–451, Academic Press, 1989.

Safran et al., "TEM study of $Ag_2Se$ developed by the reaction of polycrystalline silver films and s 1 nium," 317 Thin Solid Films, pp. 72–76, 1998.

Shimizu et al., "The Photo–Erasable Memory Switching Effect of Ag Photo–Doped d Chalcogenide Glasses," 46 Bul. Chem. Soc. Japan, No. 12, pp. 3662–3665, Dec. 1973.

Somogyi et al., Temperature Dependence of the Carrier Mobility in $Ag_2Se$ Layers Grown on NaCl and $SiO_x$ Substrates, 74 Acta Physica Hungarica, No. 3, pp. 243–255, 1994.

Tai et al., "Multilevel Ge–Se film based resist systems," SPIE vol. 333 Submicron Lithography, pp. 32–39, Mar. 1982.

Tai et al., "Submicron optical lithography using an inorganic resist/polymer bilevel scheme," 17 J. Vac. Sci. Technol., No. 5, pp. 1169–1176, Sep./Oct. 1980.

West, Dissertation: "Electrically Erasable Non–Volatile Memory Via electrochemical Deposition of Multifractal Aggregates," Arizona State University, pp. title page–168, UMI Co., May 1998.

West et al., Equivalent Circuit Modeling of the $Ag/As_{0.24}S_{0.38}Ag_{0.40}/Ag$ System Prepared by Photodissolution of Ag, 145 J. Electrochem. Soc., No. 9, pp. 2971–2974, Sep. 1998.

Yoshikawa et al., "A new inorganic electron resist of high contrast," 31 Appl. Phys. Lett., No. 3, pp. 161–163, Aug. 1977.

Yoshikawa et al., "Dry development of Se–Ge Inorganic photoresist," 36 Appl. Phys. Lett., No. 1, pp. 107–109, Jan. 1980.

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 1999.

Helbert et al., "Intralevel hybrid resist process with submicron capability," SPIE vol. 333 Submicron Lithography, pp. 24–29, (1982).

M.N. Kozicki and M. Mitkova, "Silver incorporation in thin films of selenium rich Ge–Se glasses," Proceedings of the XIX International Congress on Glass, Society for Glass Technology, 226–227 (2001).

Kozicki, et al., "Nanoscale phase separation in Ag–Ge–Se glasses," Microelectronic Engineering, vol. 63/1–3, 155–159 (2002).

Kozicki, et al., "Nanoscale effects in devices based on chalcogenide solid solutions," Superlattices and Microstructures, 27, 485–488 (2000).

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and ch mical thr sholds in IV–VI chalcogenide glasses, Phys. R v. L 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5l: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RgAg4I5, Solid State Ionics 70/71 (1994) 72–76.

Boolchand, P., The maximum in glass transition temperature (Tg) near $x=1/3$ in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Br ss r, W.J.; Boolchand, P.; Suranyi, P.; Hernandez, J.G., Molecular phase separation and cluster siz in G S 2 glass, Hyperfind Interactions 27 (1986) 389–392.

Cahen, D.; Gilet, J.–M.; Schmitz, C.; Ch rnyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2672.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Propeties of $Ag_2-xSe1+x/n–Si$ diodes, Thin Solid Films 110 (1983) 107–113.

El Gharras, Z.; Bourahla, A.; Vautier, C., Role of Photoinduced defects in amorphous $GexSe1-x$ photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70a (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A Unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of $Ge20BixSe80-x$ films, Thin Solid Films 376 (2000) 236–240.

Fadel, M., Switching ph nom non in evaporated S –Ge–As thin films of amorphous chalcogenid glass, Vacuum 44 (1993) 851–855.

Fadel, M.; El–Shari, H.T., Electrical, thermal and optical properti s f Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of $Ag_2Se$ can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non Cryst. Solids 298 (2002) 260–269.

Guin, J.–P.; Rouxel, T.; Sangleboeuf, J.–C; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen A.E. Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal-l–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys 13 (1974) 1163–1164.

Hegab, N.A.; Fadel, M.; Sedeek, K., Memory switching pehnomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy $GexSe1-x$ around th stiffness threshold composition, J. Optoelectroncis and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull 8 (1973) 433–442.

Kaplan, T.; Adler, D., Electrothermal switching in amorphous semiconductors. J. Non–Cryst. Solids 8–10 (1972) 538–543.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259–269.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalocogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar. A., Amorphous semiconductor devices: memory and switching mechanism, J. Instn Electronics & Telecom. Engrs 27 (1981) 16–19.

Lal, M.; Goyal N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1-x glass, Appl. Phys. Lett., 46 (1985) 543–545.

Matsushita, T.; Yamagami, T.; Okuda, M., Polarized memory eff ct observed on Se–SnO2 system, Jap. J. Appl. Phys. 11 (1972) 1657–1662.

Matsushita, T.; Yamagami, T.; Okuda, M., Polarized memory effect observed on amorphous selenium thin films Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef. A., Electrical characterization of M/Se structures (M=Ni, Bi), Mat. Chem. And Phys 28 (1991) 253–258.

Mitkova, M.; Boolchand, P., Microscopic origin of the glass forming tendency in chalogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in (AgxCu1-x)2Se, J. Phys. Soc. Japan 34 (1973) 423–432.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1-x amorphous thin films, Jap. J. App. Phys 15 (1976) 849–853.

Narayanan, R.A.; Asokan, S.; Kumar, A., Evidence concerning the effect of topology on electrical switching in chalcogenide network glasses, Phys. Rev. B54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily rev rsible memory switching in G –As–Te glass s, J. Phys. D: Appl. Phys 29 (1996) 2004–2008.

Rahman, S.; Silvarama Sastry, G., El ctronic switching in Ge–Bi–Se–Te glasses, Mat. Sci. and Eng. B12 (1992) 219–222.

Ramesh, K.; Asokan. S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.;Snell,A.J.;Owen, A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in a–Si:H Memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh. B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys 8 (1975) L120–L122.

Steventon, A.G., The switching mechanism in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory ff cts, Thin Solid Films 57 (1979) 49–54.

Uemura, O.; Kameda, Y.; Kokai, S.; Satow, T., Thermally induced crystallization f amorphous G 0.4S 0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High performance Metal/sillicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepares by photodissolution of Ag, J. Electrochem. Soc. 145 (1998) 2971–2974.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Hirose et al., "High Speed Memory Behavior and Reliability of an Amorphous $As_2S_3$ Film Doped Ag," Phys. Stat. Sol. (a) 61, pp. K187–K190 (Jul. 17, 1980).

Hirose, Y.; Hirose, H., "Polarity–dependent memory switching and behavior of Ag dendrite in Ag–photodoped $AS_2S_3$ films," 47 J. Appl. Phys. No. 6, 2767–2772 (Jun. 1976).

Kawaguchi et al., "Optical, electrical, and structural properties of amorphous Ag–Ge–S and Ag–Ge–Se films and . . . , " J. Appl. Phys. No. 12, pp. 9096–9104 (Jun. 1996).

Kluge et al., "Silver photodiffusion in amorphous $Ge_xSE_{100-x}$," 124 Journal of Non–Crystalline Solids, pp. 186–193 (1990).

Kolobov et al., "Photodoping of amorphous chalcogenides by metals," 40 Advances in Physics, No. 5, pp. 625–684 (1991).

Mikova et al., "Dual Chemical Role of Ag as an Additive in Chalgogenide Glasses," 83 Physical Review Letters, No. 19, pp. 3848–3851 (Nov. 8, 1999).

Mitkova, "Real Time Optical Recording on Thin Films of Amorphous Semiconductors, Insulating and Semiconducting Glasses," pp. 813–843 (P. Boolchand ed., World Scientific 2000).

Shimakawa et al., "Photoinduced effects and metastability in amorphous semiconductors and Insulators," 44 Advances in Physics, No. 6, pp. 475–588 (1995).

Johnson et al., "Lateral Diffusion in Ag–Se Thin–Film Couples," 40 Journal of Applied Physics, No. 1, pp. 149–152 (Jan. 1969).

* cited by examiner

METHODS OF FORMING NON-VOLATILE RESISTANCE VARIABLE DEVICES AND METHODS OF FORMING SILVER SELENIDE COMPRISING STRUCTURES

This application is a continuation of application Ser. No. 10/061,825 filed on Jan. 31, 2002, now abandoned which is incorporated herein by reference.

TECHNICAL FIELD

This invention relates to methods of forming non-volatile resistance variable devices, and to methods of forming silver selenide comprising structures.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in U.S. Pat. Nos. 5,761,115; 5,896,312; 5,914,893; and 6,084,796 to Kozicki et al., which ultimately resulted from U.S. patent application Ser. No. 08/652,706, filed on May 30, 1996, disclosing what is referred to as a programmable metallization cell. Such a cell includes opposing electrodes having an insulating dielectric material received therebetween. Received within the dielectric material is a variable resistance material. The resistance of such material can be changed between low resistance and high resistance states. In its normal high resistance state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the resistance variable material is such that it undergoes a change at a certain applied voltage. With such voltage applied, a low resistance state is induced into the material such that electrical conduction can occur between the top and bottom electrodes.

Once this occurs, the low resistance state is retained when the voltage potentials are removed. Such can effectively result in the resistance -of the mass of resistance variable material between the electrodes dropping by a factor of 1,000. Such material can be returned to its highly resistive state by reversing the voltage potential between the anode and cathode. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. One specific example includes one or more layers of germanium selenide having silver ions diffused therein and one or more layers of silver selenide having excess silver ions diffused therein. It is, however, difficult to form silver rich silver selenide.

While the invention was principally motivated in addressing the above issues, it is in no way so limited. The artisan will appreciate applicability of the invention in other aspects unrelated to the above issues, with the invention only being limited by the accompanying claims as literally worded without limiting reference to the specification, and as appropriately interpreted in accordance with the doctrine of equivalents.

SUMMARY

The invention includes methods of forming non-volatile resistance variable devices, and methods of forming silver selenide comprising structures. In one implementation, a method of forming a non-volatile resistance variable device includes forming a patterned mass comprising elemental silver over a substrate. A layer comprising elemental selenium is formed over the substrate and including the patterned mass comprising elemental silver. The substrate is exposed to conditions effective to react only some of the elemental selenium with the elemental silver to form the patterned mass to comprise silver selenide. Unreacted elemental selenium is removed from the substrate. A first conductive electrode is provided in electrical connection with one portion of the patterned mass comprising silver selenide. A germanium selenide comprising material is provided in electrical connection with another portion of the patterned mass comprising silver selenide. A second conductive electrode is provided in electrical connection with the germanium selenide comprising material.

In one implementation, a method of forming a silver selenide comprising structure includes forming a substrate comprising a first outer portion and a second outer portion. The first outer portion comprises a patterned mass comprising elemental silver. The second outer portion does not comprise elemental silver. A layer comprising elemental selenium is formed over the first and second outer portions. The substrate is exposed to oxidizing conditions effective to both, a) react elemental selenium received over the first portion with elemental silver to form the patterned mass to comprise silver selenide, and b) remove elemental selenium of the layer over the second outer portion from the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
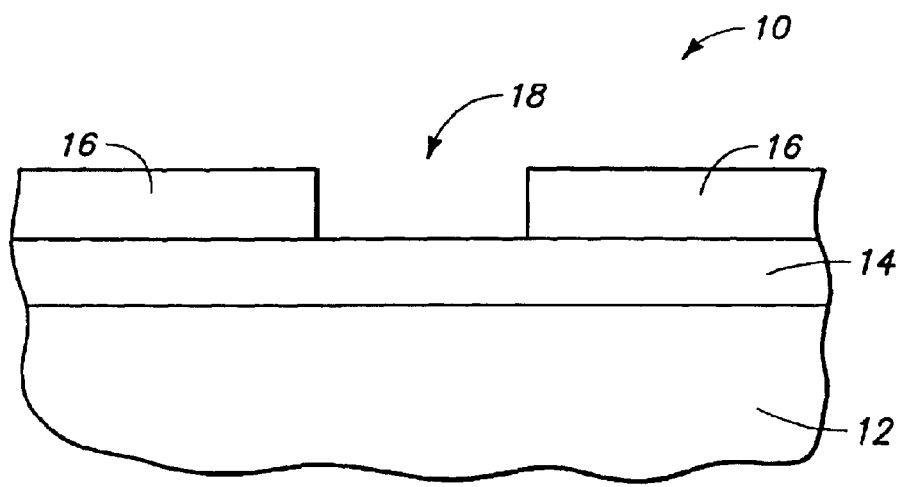
FIG. 1 is a diagrammatic perspective view of a semiconductor wafer fragment/section in process in accordance with an aspect of the invention.

Exemplary embodiment methods of forming a non-volatile resistance variable device are initially described with reference to FIGS. 1–8. FIG. 1 depicts a substrate fragment 10 comprising a base substrate 12 and a first conductive electrode material 14 formed thereover. Base substrate 12 might comprise any suitable supporting substrate, for example a semiconductor substrate which includes bulk monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Exemplary preferred material for layer 14 is elemental tungsten.

An insulative material 16 is formed over first conductive electrode material 14. Such has been patterned by any suitable patterning method (i.e., lithography, such as photolithography) to form an opening 18 therethrough to first conductive electrode material 14. Opening 18 comprises some desired shape of at least a portion of a final resistance setable structure of the device being fabricated, as will be apparent from the continuing discussion.

Figure 2:
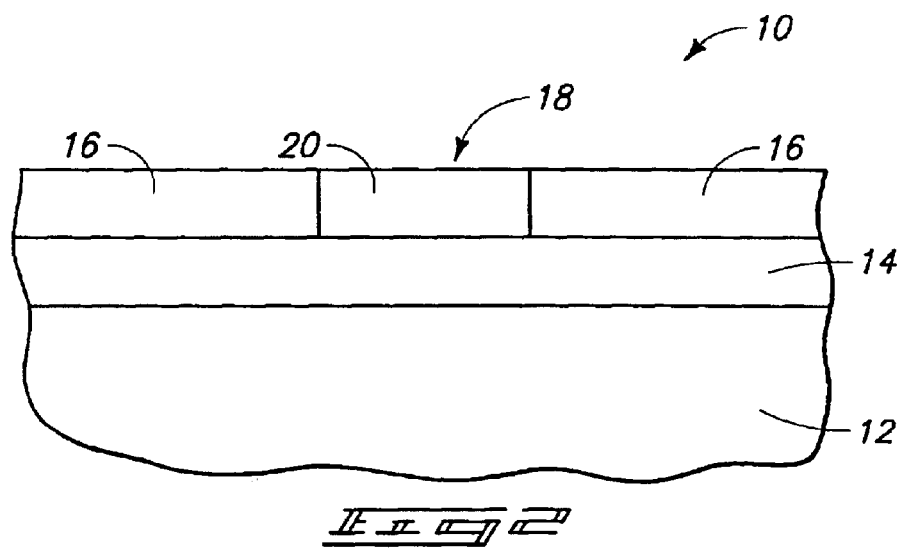
FIG. 2 is a view of the FIG. 1 wafer fragment at a processing step subsequent to that shown by FIG. 1.

Referring to FIG. 2, opening 18 has been filled with an elemental silver comprising material 20 in electrical connection with first conductive electrode material 14. An exemplary preferred material for material 20 includes at least 50 molar percent elemental silver, even more preferably at least 95 molar percent elemental silver, and even more preferably greater than 99 molar percent elemental silver. In the illustrated preferred example, insulative material 16 has a substantially planar outermost surface proximate opening 18, and patterned mass/elemental silver comprising material 20 within opening 18 has an outermost surface which is co-planar with the insulative material outer surface. Further, patterned mass 20 can be considered as having some maximum first thickness, with an example thickness range being from about 50 Angstroms to about 2000 Angstroms.

One example method of producing the construction illustrated by FIG. 2 would be to deposit a layer of silver comprising material blanketly over the substrate, and then planarizing such layer back at least to the top of outer insulative layer 16. By way of example only, such deposition might occur by chemical or physical means. Further, the polishing or planarizing could occur by resist etch back, chemical polishing, mechanical polishing or any combination thereof, or by any other existing or yet-to-be-developed method. Further, alternately and by way of example only, the illustrated FIG. 2 construction might be fabricated by an electroless or other deposition of silver comprising material 20 within the illustrated opening such that material 20 effectively only deposits therein and grows upwardly, with the growth preferably being stopped where material 20 approximately reaches the upper surface of insulative material 16. Regardless, FIG. 2 depicts but one example of forming a patterned mass comprising elemental silver over a substrate.

Figure 3:
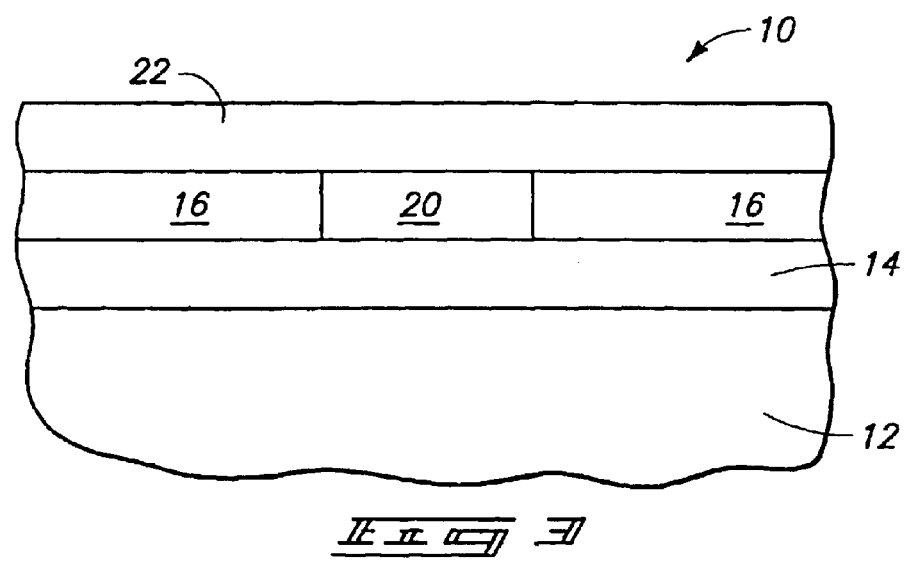
FIG. 3 is a view of the FIG. 2 wafer fragment at a processing step subsequent to that shown by FIG. 2.

Referring to FIG. 3, a layer 22 comprising elemental selenium is formed over substrate 10 and including patterned mass 20 comprising elemental silver. Preferably, layer 22 comprises elemental selenium of at least 90 molar percent, more preferably at least 95 molar percent elemental selenium, and even more preferably greater than 99 molar percent elemental selenium.

Figure 4:
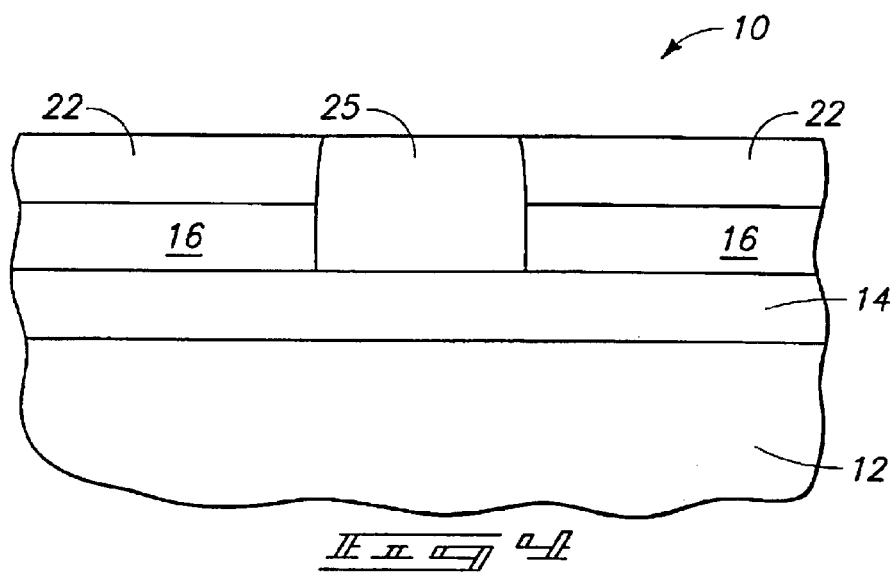
FIG. 4 is a view of the FIG. 3 wafer fragment at a processing step subsequent to that shown by FIG. 3.

Referring to FIG. 4, substrate 10 has been exposed to conditions effective to react elemental selenium 22 received over the elemental silver of mass 20 to form at least a portion of the filled opening/patterned mass to comprise silver selenide 25. In the depicted and preferred embodiment, such exposing to the conditions are effective to react only some of elemental selenium comprising layer 22, with those portions formed over insulative material 16 being essentially unreacted. In the FIG. 4 depicted and preferred embodiment, the exposing is illustrated as forming the patterned mass to entirely comprise silver selenide material 25. Regardless, the exposing preferably forms that portion of the patterned mass which is transformed to comprise at least 50 molar percent silver selenide, and more preferably at least 80 molar percent silver selenide. Further preferably, that portion which is formed is ideally substantially homogenous.

Figure 5:
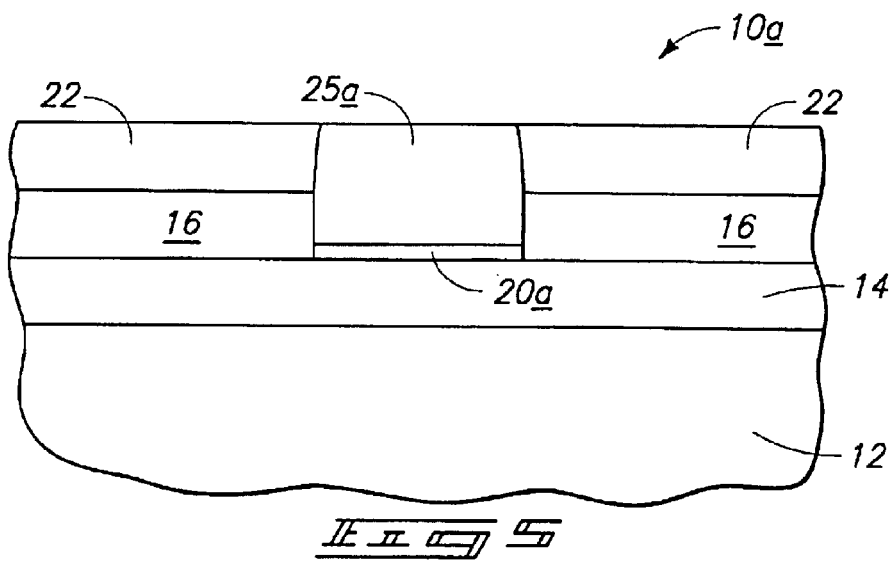
FIG. 5 is an alternate view of the FIG. 3 wafer fragment at an alternate processing step subsequent to that shown by FIG. 3.

FIG. 5 depicts an alternate embodiment 10a. Like numerals from the first embodiment are utilized where appropriate, with differences being indicated by the suffix "a". FIG. 5 depicts forming an outermost portion 25a of the patterned mass to comprise silver selenide, while an innermost portion 20a of the patterned mass remains as the deposited silver comprising material initially formed. By way of example only, the remaining thickness of innermost portion 20a is preferably from 0 to 10 percent of the total thickness of the illustrated patterned mass. Each of FIGS. 4 and 5 depicts but one embodiment wherein the exposing forms more than one-half of the filled opening to comprise silver selenide. Alternately, by way of example only, one-half or less than one-half might be filled. Further in the preferred embodiment as shown, the exposing forms the patterned mass to have a maximum second thickness which is greater than the maximum first thickness.

One example preferred process for the subject exposing includes annealing the substrate at a temperature of from about 40° C. to about 100° C. at a pressure of from about 30 mTorr to 760 Torr for from about one to three hours. Higher temperatures typically result in a higher annealing rate. Conditions and time can be controlled to achieve a desired amount of the mass to be transformed to silver selenide comprising material. Further, by way of example only, annealing in a suitable oxidizing atmosphere is also a possibility, as is more fully described below.

Figure 6:
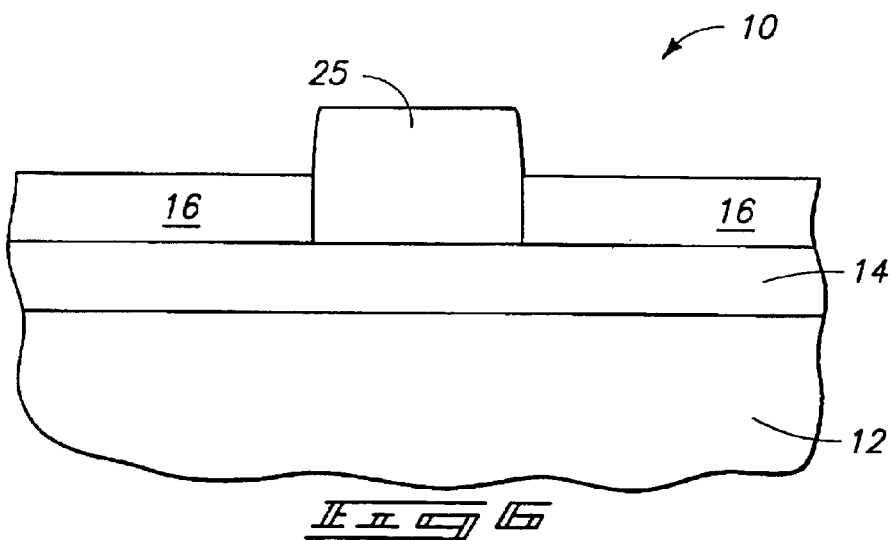
FIG. 6 is a view of the FIG. 4 wafer fragment at a processing step subsequent to that shown by FIG. 4.

Referring to FIG. 6, unreacted elemental selenium 22 has been removed from the substrate. The preferred removing, as shown, removes all remaining unreacted elemental selenium from the substrate. One example of removing comprises chemical etching, and preferably in a manner which is selective to remove elemental selenium comprising material 16 selectively relative to silver selenide comprising material 25. An example wet etch for doing so would include utilizing hydrogen peroxide, for example at from room temperature to 50° C. and ambient pressure. An example dry process would include plasma etching using $CF_4$. Further by way of example only, an alternate process for removing unreacted elemental selenium comprises increasing the temperature of the substrate to closer to the melting temperature of selenium, say from 200° C. to 250° C., and at atmospheric pressure for from 10 minutes to one hour, effective to cause evaporation of the unreacted selenium from the substrate.

Figure 7:
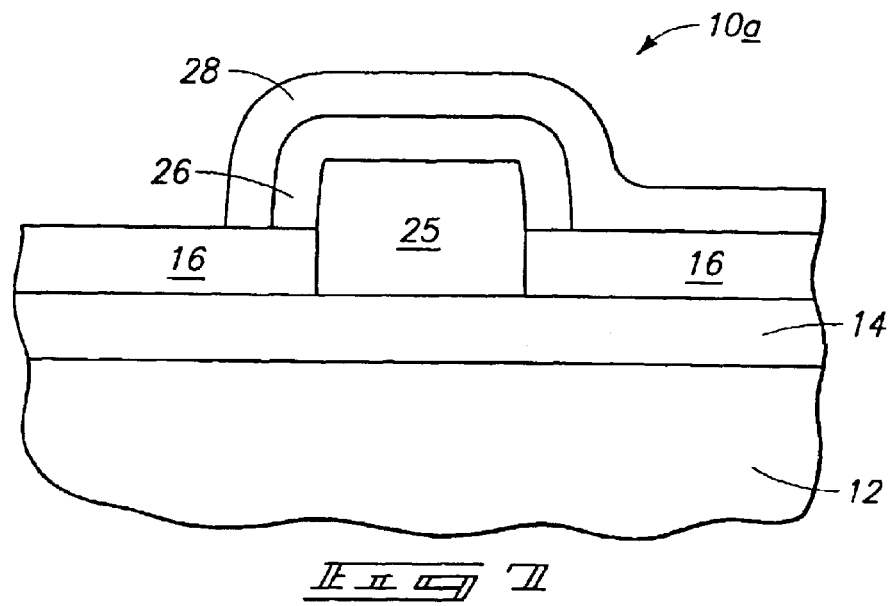
FIG. 7 is a view of the FIG. 6 wafer fragment at a processing step subsequent to that shown by FIG. 6.

Referring to FIG. 7, a germanium selenide material layer 26 (i.e., preferably 40 molar percent germanium and 60molar percent selenium) is formed over and in electrical connection with silver selenide comprising material 25. A second conductive electrode material 28 is formed thereover, and thereby in electrical connection with silver selenide 25 through material 26. Second conductive electrode material 28 might be the same as first conductive electrode material 14, or be different. An exemplary preferred material for electrode 28 in the depicted and described embodiment is elemental silver. Regardless, in the preferred embodiment such provides exemplary processing of providing a first conductive electrode in electrical connection with one portion of patterned mass 25 comprising silver selenide, providing a germanium selenide comprising material in electrical connection with another portion of the patterned mass comprising silver selenide, and providing a second conductive electrode in electrical connection with the germanium selenide comprising material.

Figure 8:
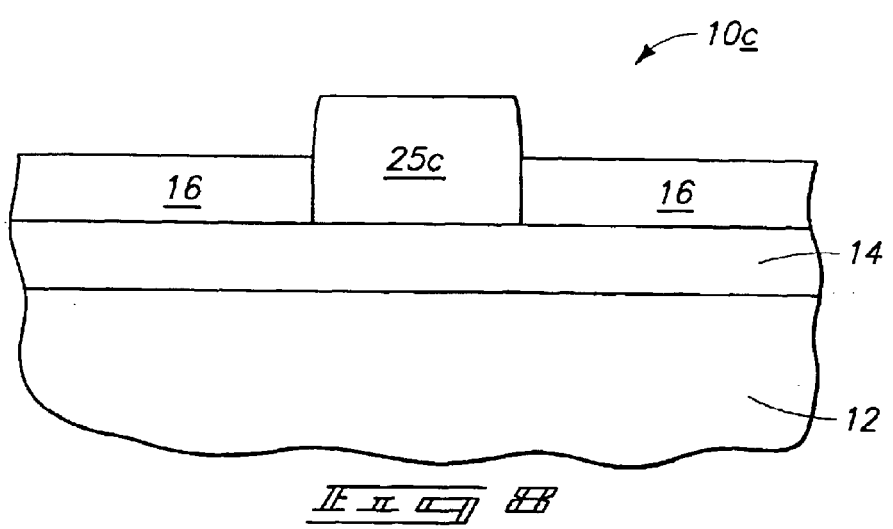
FIG. 8 is an alternate view of the FIG. 3 wafer fragment at an alternate processing step subsequent to that shown by FIG. 3.

The above-described exemplary preferred embodiment processes conducted the exposing and the removing in different or separate processing steps. The invention also contemplates conducting the exposing and the removing in the same or single common processing step. FIG. 8 depicts an alternate embodiment 10c which depicts an alternate processing of the FIG. 3 wafer which produces a slightly modified construction to that depicted by FIG. 4. In FIG. 8, the exposing and the removing have occurred in a common processing step comprising at least 100° C. and an atmosphere which removes unreacted elemental selenium by oxidation thereof. Preferably, the oxidizing atmosphere utilizes a weak oxidizer or a dilute oxidizer, for example at less than or equal to five percent by volume oxidizer, with less than or equal to one percent being more preferred. An example preferred oxidizing atmosphere comprises at least one of $N_2O$, $NO_x$, $O_3$, $F_2$ and $Cl_2$. By way of example only, preferred conditions include an elevated temperature of from 40° C. to 250° C., a pressure at from 30 mTorr to 760 Torr and from 30 minutes to two hours.

The oxidizing conditions and atmosphere are preferably selected to be sufficiently dilute or weak, as identified above, to prevent the complete oxidation of selenium comprising material 22 over patterned mass 20 prior to driving (either physically or by reacting) elemental selenium into patterned mass 20 such that an effective silver selenide mass 25c is formed. However, such oxidizing will typically result in some removal of elemental selenium by oxidation at the outermost portion of elemental selenium comprising layer 22 over the patterned mass during the oxidizing. Most preferably in this and any embodiment, the exposing drives at least a majority of that portion of the elemental selenium received over the patterned mass into the patterned mass.

The invention further contemplates a method of forming any silver selenide comprising structure regardless of whether such is utilized in the fabrication of a non-volatile resistance variable device. Such method contemplates forming a substrate comprising a first outer portion and a second outer portion, with the first outer portion constituting a patterned mass comprising elemental silver and the second portion not comprising elemental silver. By way of example only and with respect to FIGS. 2 and 3, an outermost portion of patterned mass 20 comprising elemental silver comprises an exemplary first outer portion, with the outermost portion of insulative 16 constituting an exemplary second outer portion. A layer comprising elemental selenium is formed over the first and second outer portions. The substrate is exposed to oxidizing conditions, by way of example only such as those described above, effective to both a) react elemental selenium received over the first portion with elemental silver to form the patterned mass to comprise silver selenide, and b) remove elemental selenium of a layer over the second outer portion from the substrate. Preferably, the exposing removes all unreacted elemental selenium from the substrate. Further, and in accordance with the above-described preferred embodiment, such exposing will tend to remove some of the elemental selenium of the layer over the first portion from the substrate, but still preferably drive at least a majority of that portion of the elemental selenium received over the first portion into the patterned mass, and more preferably at least 80 molar percent. Further, such exposing preferably forms the patterned mass to have a maximum second thickness which is greater than its maximum first thickness immediately prior to the exposing.

Figure 9:
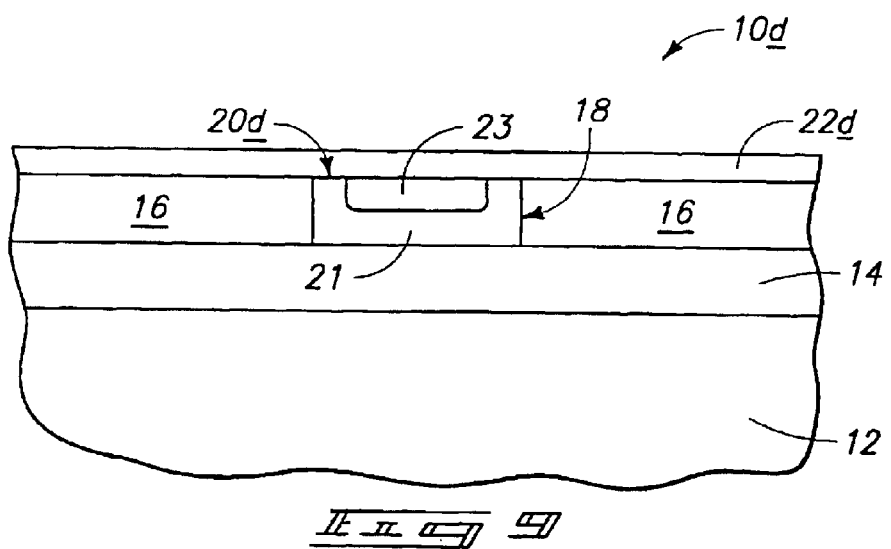
FIG. 9 is a diagrammatic perspective view of an alternate embodiment semiconductor wafer fragment/section in process in accordance with an aspect of the invention.
Figure 10:
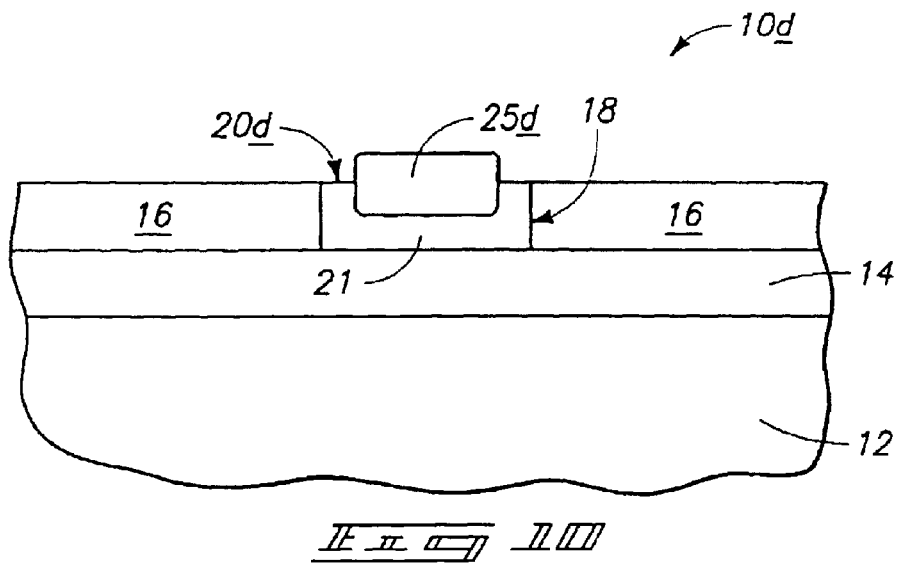
FIG. 10 is a view of the FIG. 9 wafer fragment at a processing step subsequent to that shown by FIG. 9.
Figure 11:
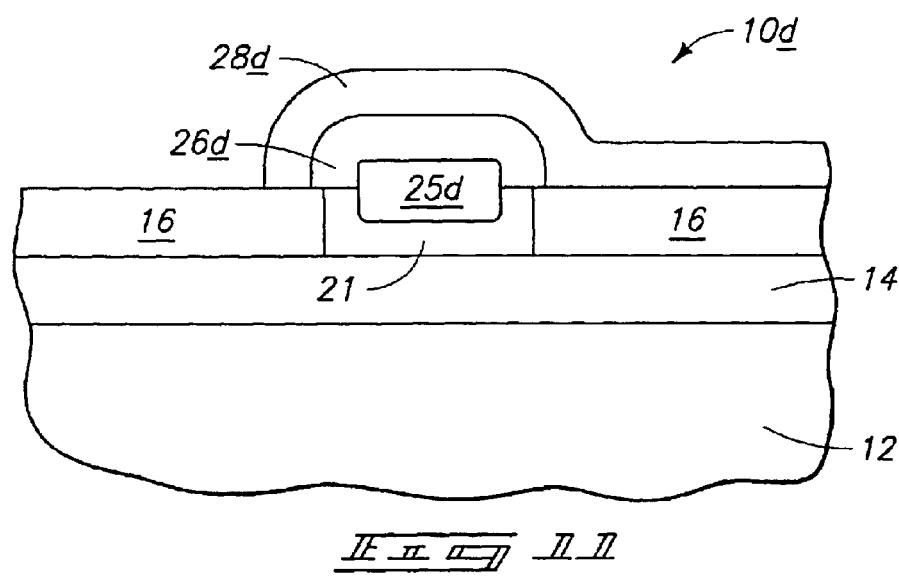
FIG. 11 is a view of the FIG. 10 wafer fragment at a processing step subsequent to that shown by FIG. 10.

The depicted and above-described embodiments show processes wherein at least a majority and in one case essentially all of the material within opening 18 is formed to comprise elemental silver. FIGS. 9–11 illustrate an alternate embodiment 10d. Like numerals from the first described embodiment are utilized where appropriate, with differences being indicated by the suffix "d" or with different numerals. FIG. 9 depicts an alternate elemental silver comprising material 20d received within opening 18. Such comprises a lower exemplary germanium selenide portion 21 (i.e., preferably 40 percent germanium and 60 percent selenium), and an overlying preferred 99 percent-plus pure elemental silver region 23. By way of example only, such could be formed by suitable deposition and planarization relative to insulative layer 16. A selenium comprising layer 22d is formed thereover.

Referring to FIG. 10, substrate 10d has been subjected to the preferred exposing and removing processing (either together or in different steps) effective to form a silver selenide mass 25d and to remove at least some, and preferably all, unreacted elemental selenium from the substrate.

Referring to FIG. 11, another germanium selenide layer 26d and a second electrode 28d are formed thereover.

The above-described embodiments describe and depict exemplary methods of forming a patterned mass comprising elemental silver. Such embodiments depict forming a patterned opening within insulative material over a substrate, and at least partially filling the opening with an elemental silver comprising material. However, the invention contemplates any method of forming a patterned mass comprising elemental silver. By way of example only, one such alternate process is described with reference to FIGS. 12–15.

Figure 12:
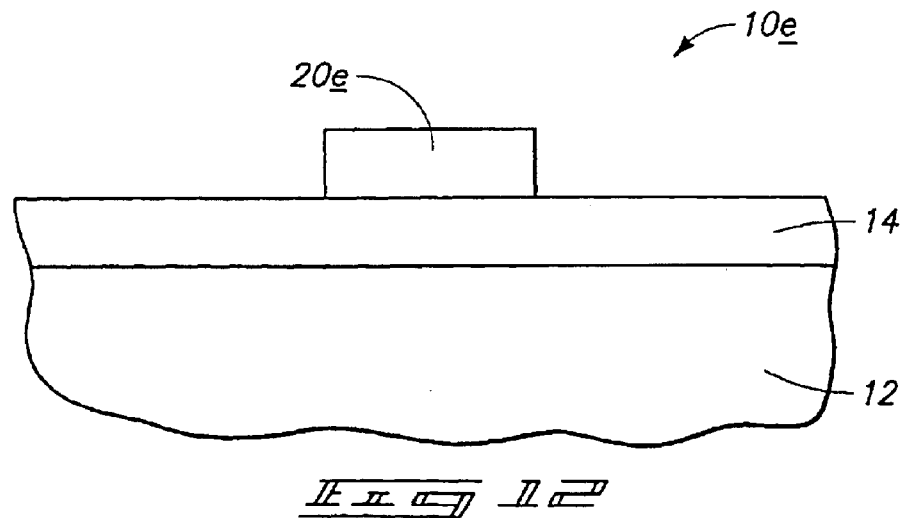
FIG. 12 is a diagrammatic perspective view of another alternate embodiment semiconductor wafer fragment/section in process in accordance with an aspect of the invention.

FIG. 12 depicts another alternate embodiment 10e, with like numerals from the first embodiment being utilized and differences being indicated with the suffix "e" or with different numerals. FIG. 12 depicts the depositing of a silver comprising material 20e. Material 20e has been patterned, for example by photopatterning and then subtractively etching after the patterning. Other patterning, such as laser patterning or any other method of patterning, is contemplated, whether existing or yet-to-be-developed.

Figure 13:
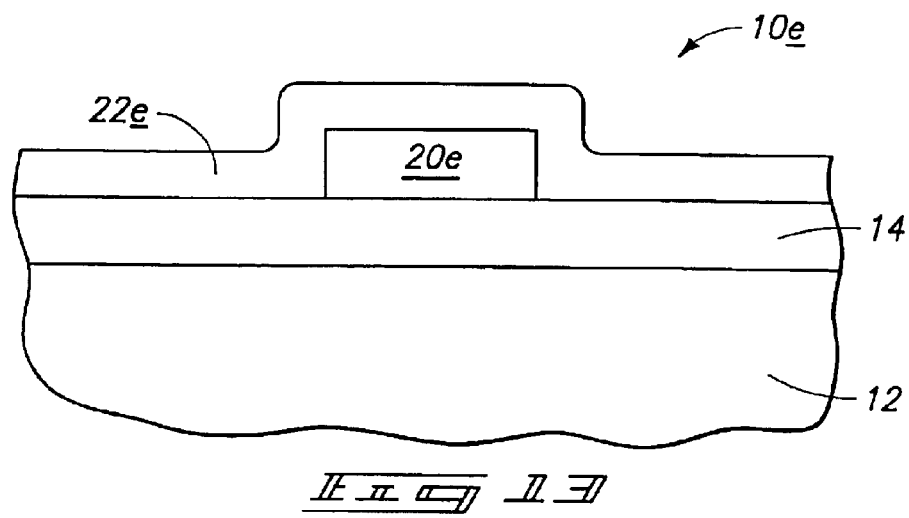
FIG. 13 is a view of the FIG. 12 wafer fragment at a processing step subsequent to that shown by FIG. 12.

Referring to FIG. 13, an elemental selenium comprising layer 22e is formed over patterned mass 20e.

Figure 14:
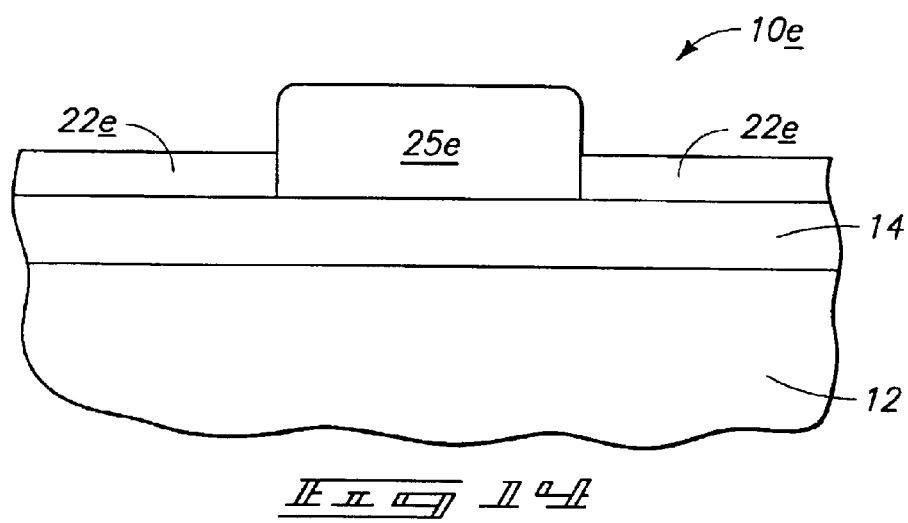
FIG. 14 is a view of the FIG. 13 wafer fragment at a processing step subsequent to that shown by FIG. 13.

Referring to FIG. 14, the substrate has been exposed to conditions effective to react only some of elemental selenium 22e with the elemental silver to form a patterned mass 25e to comprise silver selenide. Any of the above-described processing, including an oxidation process which removes 22e from the process during the exposing, is contemplated, of course, and are only preferred examples.

Figure 15:
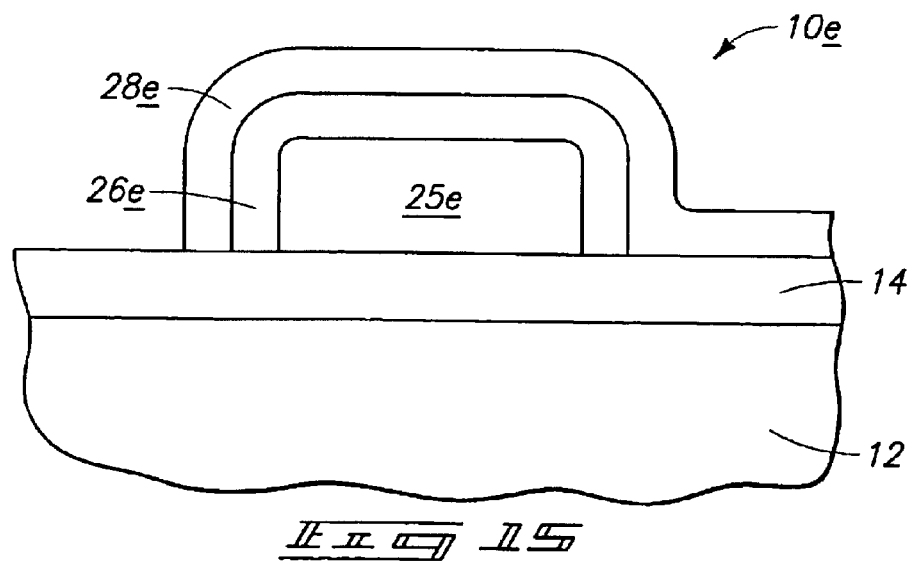
FIG. 15 is a view of the FIG. 14 wafer fragment at a processing step subsequent to that shown by FIG. 14.

Referring to FIG. 15, a preferred germanium selenide layer 26e and a preferred second electrode 28e are formed thereover.

The above constructions can be effectively preferably fabricated to form programmable metallization cells over memory and other integrated circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a non-volatile resistance variable device, comprising:
   forming a patterned mass comprising elemental silver over a substrate;
   forming a layer comprising elemental selenium over the substrate and including the patterned mass comprising elemental silver;
   exposing the substrate to conditions effective to react only some of the elemental selenium with the elemental silver to form the patterned mass to comprise silver selenide;
   removing unreacted elemental selenium from the substrate;
   providing a first conductive electrode in electrical connection with one portion of the patterned mass comprising silver selenide;
   providing a germanium selenide comprising material in electrical connection with another portion of the patterned mass comprising silver selenide; and
   providing a second conductive electrode in electrical connection with the germanium selenide comprising material.

2. The method of claim 1 wherein the patterned mass comprises at least 50 molar percent elemental silver prior to the exposing.

3. The method of claim 1 wherein the patterned mass comprises at least 95 molar percent elemental silver prior to the exposing.

4. The method of claim 1 wherein the layer comprising elemental selenium comprises at least 90 molar percent elemental selenium prior to the exposing.

5. The method of claim 1 wherein the layer comprising elemental selenium comprises at least 95 molar percent elemental selenium prior to the exposing.

6. The method of claim 1 wherein the exposing and the removing occur in a common processing step.

7. The method of claim 1 wherein the exposing and the removing occur in different processing steps.

8. The method of claim 1 wherein the exposing and the removing occur in a common processing step comprising at least 40° C. and an atmosphere which removes unreacted elemental selenium by oxidation thereof.

9. The method of claim 1 wherein the removing of the unreacted elemental selenium comprises chemical etching after the exposing.

10. The method of claim 1 wherein the removing of the unreacted elemental selenium comprises evaporation after the exposing.

11. The method of claim 1 wherein the exposing forms the patterned mass to comprise at least 50 molar percent silver selenide.

12. The method of claim 1 wherein the exposing forms the patterned mass to comprise at least 80 molar percent silver selenide.

13. The method of claim 1 wherein the exposing drives at least a majority of that portion of the elemental selenium received over the patterned mass into the patterned mass.

14. The method of claim 1 wherein the patterned mass comprises greater than 50 molar percent elemental silver prior to the exposing, the exposing forming an outermost portion of the patterned mass to comprise greater than 50 molar percent silver selenide, with an innermost portion of the patterned mass remaining at greater than 50 molar percent elemental silver.

15. The method of claim 1 wherein the patterned mass comprises greater than 90 molar percent elemental silver prior to the exposing, the exposing forming an outermost portion of the patterned mass to comprise greater than 90 molar percent silver selenide, with an innermost portion of the patterned mass remaining at greater than 90 molar percent elemental silver.

16. The method of claim 1 wherein the patterned mass as formed prior to the exposing has a maximum first thickness, the exposing forming the patterned mass to have a maximum second thickness which is greater than the maximum first thickness.

17. The method of claim 1 wherein the removing removes all unreacted elemental selenium from the substrate.

18. The method of claim 1 wherein forming the patterned mass comprising elemental silver comprises depositing an elemental silver comprising material, photopatterning it, and subtractively etching it after the photopatterning.

19. The method of claim 1 wherein forming the patterned mass comprising elemental silver comprises forming a patterned opening within insulative material over the substrate, and at least partially filling the opening with an elemental silver comprising material.

20. A method of forming a non-volatile resistance variable device, comprising:
   forming a patterned mass comprising least 90 molar percent elemental silver over a substrate and to a first maximum thickness;
   forming a layer comprising at least 90 molar percent elemental selenium over the substrate and including the patterned mass comprising elemental silver;
   exposing the substrate to conditions effective to react only some of the elemental selenium with the elemental silver to form the patterned mass to comprise silver selenide, the exposing forming the silver selenide to be rich in silver, and forming the patterned mass to have a maximum second thickness which is greater than the maximum first thickness, the exposing forming the patterned mass to comprise at least 80 molar percent silver selenide, the exposing driving at least a majority of that portion of the elemental selenium received over the patterned mass into the patterned mass;

removing all unreacted elemental selenium from the substrate;

providing a first conductive electrode in electrical connection with one portion of the patterned mass comprising silver selenide;

providing a germanium selenide comprising material in electrical connection with another portion of the patterned mass comprising silver selenide; and providing a second conductive electrode in electrical connection with the germanium selenide comprising material.

21. A method of forming a non-volatile resistance variable device, comprising:

forming a first conductive electrode material over a substrate;

forming an insulative material over the first conductive electrode material and an opening therethrough to the first conductive electrode material, the opening comprising a desired shape of at least a portion of a final resistance setable structure of the device;

filling the opening with an elemental silver comprising material in electrical connection with the first conductive electrode material;

forming a layer comprising elemental selenium over the insulative material and over the elemental silver comprising material within the opening;

exposing the substrate to conditions effective to react elemental selenium received over the elemental silver to form at least a portion of the filled opening to comprise silver selenide;

removing unreacted elemental selenium received over the insulative material from the substrate; and providing a germanium selenide comprising material in electrical connection with the silver selenide; and providing a second conductive electrode in electrical connection with the germanium selenide comprising material.

22. The method of claim 21 wherein the exposing forms at least a majority portion of the filled opening to comprise silver selenide.

23. The method of claim 21 wherein the exposing forms less than one half of the filled opening to comprise silver selenide.

24. The method of claim 21 wherein the elemental silver comprising material comprises at least 50 molar percent elemental silver prior to the exposing.

25. The method of claim 21 wherein the elemental silver comprising material comprises at least 95 molar percent elemental silver prior to the exposing.

26. The method of claim 21 wherein the layer comprising elemental selenium comprises at least 90 molar percent elemental selenium prior to the exposing.

27. The method of claim 21 wherein the layer comprising elemental selenium comprises at least 95 molar percent elemental selenium prior to the exposing.

28. The method of claim 21 wherein the exposing and the removing occur in a common processing step.

29. The method of claim 21 wherein the exposing and the removing occur in different processing steps.

30. The method of claim 21 wherein the exposing and the removing occur in a common processing step comprising at least 40° C. and an atmosphere which removes unreacted elemental selenium by oxidation thereof.

31. The method of claim 21 wherein the removing of the unreacted elemental selenium comprises chemical etching after the exposing.

32. The method of claim 21 wherein the removing of the unreacted elemental selenium comprises evaporation after the exposing.

33. The method of claim 21 wherein the exposing forms at least 80% of the filled opening to comprise silver selenide.

34. The method of claim 21 wherein the exposing drives at least a majority of that portion of the elemental selenium received over the elemental silver comprising material into the elemental silver comprising material.

35. The method of claim 21 wherein the filled opening comprises greater than 50 molar percent elemental silver prior to the exposing, the exposing forming an outermost portion of the filled opening to comprise greater than 50 molar percent silver selenide, with an innermost portion of the filled opening remaining at greater than 50 molar percent elemental silver.

36. The method of claim 21 wherein the filled opening comprises greater than 90 molar percent elemental silver prior to the exposing, the exposing forming an outermost portion of the filled opening to comprise greater than 90 molar percent silver selenide, with an innermost portion of the filled opening remaining at greater than 90 molar percent elemental silver.

37. The method of claim 21 wherein the insulative material has a substantially planar outermost surface proximate the opening and the elemental silver comprising material within the filled opening has an outermost surface which is coplanar with the insulative material outer surface prior to the exposing, the elemental silver comprising material within the opening prior to the exposing having a maximum first thickness, the exposing forming the patterned mass to have a maximum second thickness which is greater than the maximum first thickness.

38. The method of claim 21 wherein the removing removes all unreacted elemental selenium from the substrate.

39. A method of forming a silver selenide comprising structure, comprising:

forming a substrate comprising a first outer portion and a second outer portion, the first outer portion comprising a patterned mass comprising elemental silver, the second outer portion not comprising elemental silver;

forming a layer comprising elemental selenium over the first and second outer portions; and exposing the substrate to oxidizing conditions effective to both, a) react elemental selenium received over the first portion with elemental silver to form the patterned mass to comprise silver selenide, and b) remove elemental selenium of the layer over the second outer portion from the substrate.

40. The method of claim 39 wherein the exposing removes some of the elemental selenium of the layer over the first portion from the substrate.

41. The method of claim 39 wherein the exposing drives at least a majority of that portion of the elemental selenium received over the first portion into the patterned mass.

42. The method of claim 39 wherein the exposing drives at least a 80 molar percent of that portion of the elemental selenium received over the first portion into the patterned mass.

43. The method of claim 39 wherein the exposing comprises a temperature of from about 40° C. to about 250° C.

44. The method of claim 39 wherein the oxidizing conditions comprise an atmosphere comprising at least one of $N_2O$, $NO_x$, $O_3$, $F_2$, and $Cl_2$.

45. The method of claim 39 wherein the exposing removes all elemental selenium of the layer over the second outer portion from the substrate.

46. The method of claim 39 wherein the exposing removes all unreacted elemental selenium from the substrate.

47. The method of claim 39 wherein the patterned mass comprises at least 95 molar percent elemental silver prior to the exposing.

48. The method of claim 39 wherein the layer comprising elemental selenium comprises at least 95 molar percent elemental selenium prior to the exposing.

49. The method of claim 39 wherein the patterned mass as formed prior to the exposing has a maximum first thickness, the exposing forming the patterned mass to have a maximum second thickness which is greater then the maximum first thickness.

50. The method of claim 39 wherein forming the patterned mass comprising elemental silver comprises depositing an elemental silver comprising material, photopatterning it, and subtractively etching it after the photopatterning.

51. The method of claim 39 wherein forming the patterned mass comprising elemental silver comprises forming a patterned opening within insulative material over the substrate, and at least partially filling the opening with an elemental silver comprising material.

* * * * *

UNITED STATES PATENT AND TRADEMARK OFFICE
CERTIFICATE OF CORRECTION

PATENT NO.    : 6,812,087 B2
DATED         : November 2, 2004
INVENTOR(S)   : Terry L. Gilton et al.

It is certified that error appears in the above-identified patent and that said Letters Patent is hereby corrected as shown below:

Title page,
Item [75], Inventors, "Giltom" should read -- Gilton --
Item [56], References Cited, U.S. PATENT DOCUMENTS, insert
-- 6,423,628 B1   7/2002   Li et al.
   6,473,332           10/2002           Ignatiev et al. --

"Miyatani, Electrical properties of Ag2Se, —J. Phys. Soc. Japan, p. 317, 1958." should read --Miyatani, Electrical Properties of $Ag_2Se$, 13 J. Phys. Soc. Japan, p. 317,1958. --

"Safran et al, "TEM study of $Ag_2Se$ developed by the reaction of polycrystalline silver films and s I nium," 317 Thin Solid Films, pp. 72-76, 1998." should read -- Safran et al., "TEM study of $Ag_2Se$ developed by the reaction of polycrystalline silver films and selenium," 317 Thin Solid Films, pp. 72-76,1998. --

"Asokan, S.; Prasad, M.V.N.; Parthasarathy, G.; Gopal, E.S.R., Mechanical and ch mical thr sholds in IV-VI chalcogenide glasses, Phys. R v. L 62 (1989) 808410." should read -- Asokan, S.; Prasad, M.V.N.; Parthasarathy, G.; Gopal, E.S.R., Mechanical and chemical thresholds in IV-VI chalcogenide glasses, Phys. Rev. Lett, 62 (1989) 808-410.--

"Br ss r, W.J.; Boolchand, P.; Suranyl, P.; Hernandez, J.G., Molecular phase separation and cluster siz In G S 2 glass, Hyperfine Interactions 27 (1986) 389-392." should read -- Bresser, W.J.; Boolchand, P.; Suranyi, P.; Hernandez, J.G., Molecular phase separation and cluster size in GeSe2 glass, Hyperfine Interactions 27 (1986) 389-392.--

"Cahen, D.; Gilet, J.-M.; Schmitz, C.; Ch rnyak, L.; Gartsman, K.; Jakubowicz, A., Room-Temperature, electric field induced creation of stable devices in CuInSe2 Crystals, Science 258 (1992) 271-274." should read -- Cahen, D.; Gilet, J. M.; Schmitz, C.; Chernyak, L.; Gartsman, K.; Jakubowicz, A., Room-Temperature, electric field induced creation of stable devices in CuInSe2 Crystals, Science 258 (1992) 271-274.--

"El Bouchairi, B.; Bemede, J.C.; Burgaud, P., Propeties of Ag2-xSel +x/n-Si diodes, Thin Solid Films 110 (1983) 107-113." should read -- El Bouchairi, B.; Bernede, J.C.; Burgaud, P., Properties of Ag2-xSel +x/n-Si diodes, Thin Solid Films 110 (1983) 107-113. --

"Fadel, M., Switching ph nom non in evaporated S -Ge-As thin films of amorphous chalcogenid glass, Vacuum 44 (1993) 851455." should read -- Fadel, M., Switching phenomenon in evaporated Se-Ge-As thin films of amorphous chalcogenide glass, Vacuum 44 (1993) 851-855.--

UNITED STATES PATENT AND TRADEMARK OFFICE
CERTIFICATE OF CORRECTION

PATENT NO. : 6,812,087 B2
DATED : November 2, 2004
INVENTOR(S) : Terry L. Gilton et al.

It is certified that error appears in the above-identified patent and that said Letters Patent is hereby corrected as shown below:

Title page (cont'd),
"Fadel, M.; El-Shari, H.T., Electrical, thermal and optical properti s f Se75Ge7Sbl8, Vacuum 43 (1992) 253-275." should read --Fadel, M.; EI-Shari, H.T., Electrical, thermal and optical properties of Se75Ge7Sbl8, Vacuum 43 (1992) 253-257. --

"Hegab, N.A.; Fadel, M.; Sedeek, K., Memory switching pehnomena in thin films of chalcogenide semiconductors, Vacuum 45 (1994) 459-462." should read -- Hegab, N.A.; Fadel, M.; Sedeek, K., Memory switching phenomena in thin films of chalcogenide semiconductors, Vacuum 45 (1994) 459-462. --

"Hosokawa, S., Atomic and electronic structures of glassy GexSel-x around th stiffness threshold composition, J. Optoelectroncis and Advanced Materials 3 (2001) 199-214." should read -- Hosokawa, S., Atomic and electronic structures of glassy GexSel-x around the stiffness threshold composition, J. Optoelectronics and Advanced Materials 3 (2001) 199-214. --

"Matsushita, T.; Yamagami, T.; Okuda, M., Polarized memory eff ct observed on SeSnO2 system, Jap. J. Appl. Phys. 11 (1972) 1657-1662." should read --Matsushita, T.; Yamagami, T.; Okuda, M., Polarized memory effect observed on Se-$SnO_2$ system, Jap. J. Appl. Phys. 11 (1972) 1657-1662.--

"Prakash, S.; Asokan, S.; Ghare, D.B., Easily rev rsible memory switching In G -As-Te glass s, J. Phys. D: Appl. Phys 29 (1996) 2004-2008." should read -- Prakash, S.; Asokan, S.; Ghare, D.B., Easily reversible memory switching in Ge-As-Te glasses, J. Phys. D: Appl. Phys. 29 (1996) 2004-2008. --

"Rahman, S.; Silvarama Sastry, G., El ctronic switching in Ge-Bi-Se-Te glasses, Mat Sci. and Eng. B12 (1992) 219-222." should read -- Rahman, S.; Silvarama Sastry, G ., Electronic switching in Ge-Bi-Se-Te glasses, Mat. Sci and Eng. B12 (1992) 219-222.--

"Tregouet, Y.; Bernede, J.C., Silver movements in Ag2Te thin films: switching and memory ff cts, This Solid Films 57 (1979) 49-54." should read -- Tregouet, Y.; Bernede, J.C., Silver movements in Ag2Te thin films: switching and memory effects, This Solid Films 57 (1979) 49-54. --

"Uemura, O.; Kameda, Y.; Kokai, S.; Satow, T., Thermally induced crystallization f amorphous G 0.4S 0.6, J. Non-Cryst. Solids 117-118 (1990) 219-221." should read -- Uemura, O.; Kameda, Y.; Kokai, S.; Satow, T., Thermally induced crystallization of amorphous Ge0.4Se0.6, J. Non-Cryst Solids 117-118 (1990) 219-221. --

UNITED STATES PATENT AND TRADEMARK OFFICE
CERTIFICATE OF CORRECTION

PATENT NO. : 6,812,087 B2
DATED : November 2, 2004
INVENTOR(S) : Terry L. Gilton et al.

It is certified that error appears in the above-identified patent and that said Letters Patent is hereby corrected as shown below:

Column 1,
Line 50, "-of" should read -- of --

Column 8,
Line 59, "comprising least" should read -- comprising at least --

Signed and Sealed this

Nineteenth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,812,087 B2  Page 1 of 1
DATED : November 2, 2004
INVENTOR(S) : Terry L. Gilton et al.

It is certified that error appears in the above-identified patent and that said Letters Patent is hereby corrected as shown below:

Title page,
Item [56], References Cited, OTHER PUBLICATIONS,
"U.S. patent application Ser. No. 6,418,049, Li et al., filed Jul. 23, 2002." should read
-- U.S. patent application Ser. No. 10/232,757, Li et al. --
"Shimizu et al.," reference, "The Photo-Erasable Memory Switching Effect of Ag Photo-Doped d Chalcogenide Glasses," 46 BUL. CHEM. SOC. Japan, No. 12, pp. 3662-3665, December 1973." should read -- Shimizu et al., "The Photo-Erasable Memory Switching Effect of Ag Photo-Doped Chalcogenide Glasses," 46 BUL. CHEM. SOC. Japan, No. 12, pp. 3662-3665, December 1973. --
"Tregouet, Y.; Bernede, J.C.," reference, "Silver movements in Ag2Te thin films: switching and memory ff cts, This Solid Films 57 (1979) 49-54." should read
-- Tregouet, Y.; Bernede, J.C., Silver movements in Ag2Te thin films: switching and memory effects, Thin Solid Films 57 (1979) 49-54. --

Signed and Sealed this

Twelfth Day of July, 2005

JON W. DUDAS
*Director of the United States Patent and Trademark Office*